(12) United States Patent
Ikura et al.

(10) Patent No.: US 11,270,971 B2
(45) Date of Patent: Mar. 8, 2022

(54) SEMICONDUCTOR DEVICE AND METHOD OF MANUFACTURING THE SAME

(71) Applicant: RENESAS ELECTRONICS CORPORATION, Tokyo (JP)

(72) Inventors: Kenji Ikura, Tokyo (JP); Hideki Ishii, Tokyo (JP); Takehiko Maeda, Tokyo (JP); Takeumi Kato, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 68 days.

(21) Appl. No.: 16/576,424

(22) Filed: Sep. 19, 2019

(65) Prior Publication Data

US 2020/0135687 A1 Apr. 30, 2020

(30) Foreign Application Priority Data

Oct. 31, 2018 (JP) .............................. JP2018-204890

(51) Int. Cl.
*H01L 23/00* (2006.01)
*H01L 23/528* (2006.01)

(52) U.S. Cl.
CPC ............ *H01L 24/48* (2013.01); *H01L 23/528* (2013.01); *H01L 24/05* (2013.01); *H01L 24/85* (2013.01); *H01L 2224/04042* (2013.01); *H01L 2224/05073* (2013.01); *H01L 2224/05083* (2013.01); *H01L 2224/05124* (2013.01); *H01L 2224/05166* (2013.01); *H01L 2224/05181* (2013.01); *H01L 2224/05624* (2013.01); *H01L 2224/08503* (2013.01); *H01L 2224/4852* (2013.01); *H01L 2224/48463* (2013.01); *H01L 2224/48507* (2013.01); *H01L 2224/48824* (2013.01); *H01L 2224/85207* (2013.01); *H01L 2924/3512* (2013.01)

(58) Field of Classification Search
CPC ......... H01L 24/05; H01L 24/48; H01L 24/85; H01L 23/528
USPC ........................................... 257/751; 438/612
See application file for complete search history.

(56) References Cited

U.S. PATENT DOCUMENTS 5,116,783 A * 5/1992 Tsumura ................. H01L 24/03
29/827
6,507,112 B1 1/2003 Kurihara et al.
(Continued)

FOREIGN PATENT DOCUMENTS

JP 2002-076051 A 3/2002

*Primary Examiner* — David Vu
*Assistant Examiner* — Brandon C Fox
(74) *Attorney, Agent, or Firm* — McDermott Will & Emery LLP

(57) ABSTRACT

A semiconductor device capable of suppressing propagation of a crack caused by a temperature cycle at a bonding part between a bonding pad and a bonding wire is provided. A semiconductor device according to an embodiment includes a semiconductor chip having bonding pads and bonding wires. The bonding pad includes a barrier layer and a bonding layer formed on the barrier layer and formed of a material containing aluminum. The bonding wire is bonded to the bonding pad and formed of a material containing copper. An intermetallic compound layer formed of an intermetallic compound containing copper and aluminum is formed so as to reach the barrier layer from the bonding wire in at least a part of the bonding part between the bonding pad and the bonding wire.

3 Claims, 14 Drawing Sheets

(56) References Cited

U.S. PATENT DOCUMENTS

| | | | |
|---|---|---|---|
| 2005/0215048 A1* | 9/2005 | Li | H01L 24/03 |
| | | | 438/622 |
| 2008/0006951 A1* | 1/2008 | Hebert | H01L 24/05 |
| | | | 257/786 |
| 2008/0203568 A1* | 8/2008 | Tanaka | H01L 24/48 |
| | | | 257/738 |
| 2010/0096437 A1* | 4/2010 | Nakao | H01L 24/85 |
| | | | 228/110.1 |
| 2015/0145148 A1* | 5/2015 | Tran | H01L 24/45 |
| | | | 257/780 |
| 2015/0200181 A1* | 7/2015 | Haga | H01L 23/49513 |
| | | | 438/127 |
| 2016/0013142 A1* | 1/2016 | Maeda | H01L 24/03 |
| | | | 257/751 |
| 2017/0053879 A1* | 2/2017 | Yeduru | H01L 24/03 |

* cited by examiner

SEMICONDUCTOR DEVICE AND METHOD OF MANUFACTURING THE SAME

CROSS-REFERENCE TO RELATED APPLICATIONS

The disclosure of Japanese Patent Application No. 2018-204890 filed on Oct. 31, 2018 including the specification, drawings and abstract is incorporated herein by reference in its entirety.

BACKGROUND OF THE INVENTION

The present invention relates to a semiconductor device and a method of manufacturing the same.

Conventionally, as a bonding wire connected to a bonding pad formed on a semiconductor chip, a bonding wire formed of a gold (Au)-based material has been widely applied. In recent years, from the viewpoint of cost reduction, a bonding wire formed of a copper (Cu)-based material has also been applied.

The bonding wire formed of the copper-based material is harder than the bonding wire formed of the gold-based material. Therefore, when the bonding wire formed of a copper-based material is applied, the bonding wire is thermocompression bonded to the bonding pad by using an ultrasonic wave so as to leave an aluminum layer between the bonding wire and a barrier layer.

In Japanese Unexamined Patent Application No. 2002-76051, there is disclosed a semiconductor device to which a bonding wire formed of a gold-based material is applied.

SUMMARY OF THE INVENTION

When the bonding wire formed of the copper-based material is thermocompression bonded to the bonding pad using the ultrasonic wave so as to leave the aluminum layer between the bonding wire and the barrier layer, stress caused by temperature cycling tends to develop cracks in the aluminum layer between the bonding wire and the barrier layer.

Other objects and novel features will become apparent from the description of this specification and the accompanying drawings.

A semiconductor device according to an embodiment includes a semiconductor chip having bonding pads and bonding wires. The bonding pad includes a barrier layer and a bonding layer formed on the barrier layer and formed of a material containing aluminum. The bonding wire is bonded to the bonding pad and formed of a material containing copper. An intermetallic compound layer formed of an intermetallic compound containing copper and aluminum is formed so as to reach the barrier layer from the bonding wire in at least a part of the bonding part between the bonding pad and the bonding wire.

According to the semiconductor device of the embodiment, it is possible to suppress propagation of a crack caused by a temperature cycle at a bonding part between a bonding pad and a bonding wire.

DESCRIPTIONS OF THE PREFERRED EMBODIMENTS

Figure 1:
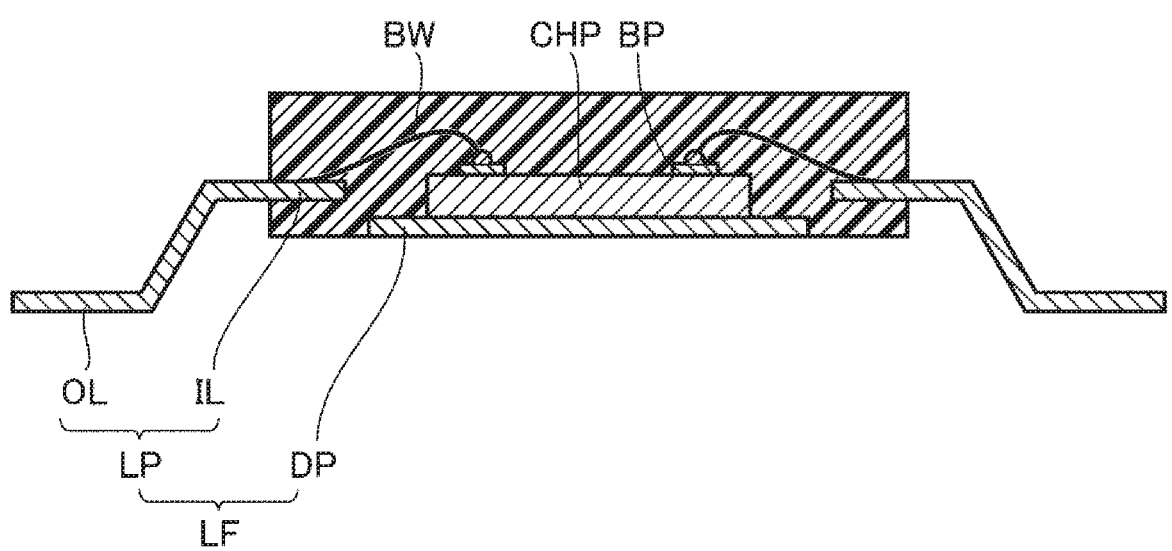
FIG. 1 is a cross-sectional view of the semiconductor device according to first embodiment.

In the following drawings, the same or corresponding parts are denoted by the same reference numerals, and the description thereof will not be repeated. At least some of the embodiments described below may be arbitrarily combined.

First Embodiment

Hereinafter, a configuration of a semiconductor device according to a first embodiment will be described.

As shown in FIG. 1, the semiconductor device according to the first embodiment includes a semiconductor chip CHP, bonding wires BW, a lead frame LF, and a sealing resin ER. The semiconductor chip CHP has bonding pads BP. The lead frame LF includes a die pad DP and a lead portion LP. The lead portion LP includes an internal lead IL and an external lead OL. The sealing resin ER is formed of an insulating thermosetting resin such as an epoxy resin, for example.

The semiconductor chip CHP is mounted on a surface of the die pad DP. The bonding wire BW is connected to the bonding pad BP at one end. The bonding wire BW is connected to the internal lead IL at the other end. The sealing resin ER seals the semiconductor chip CHP, the bonding wire BW, the die pad DP, and the internal leads IL. However, the back surface of the die pad DP is exposed from the sealing resin ER. That is, the semiconductor device according to the first embodiment has a Low-Profile Quad Flat Package with Heat sink (HLQFP) structure.

Figure 2:
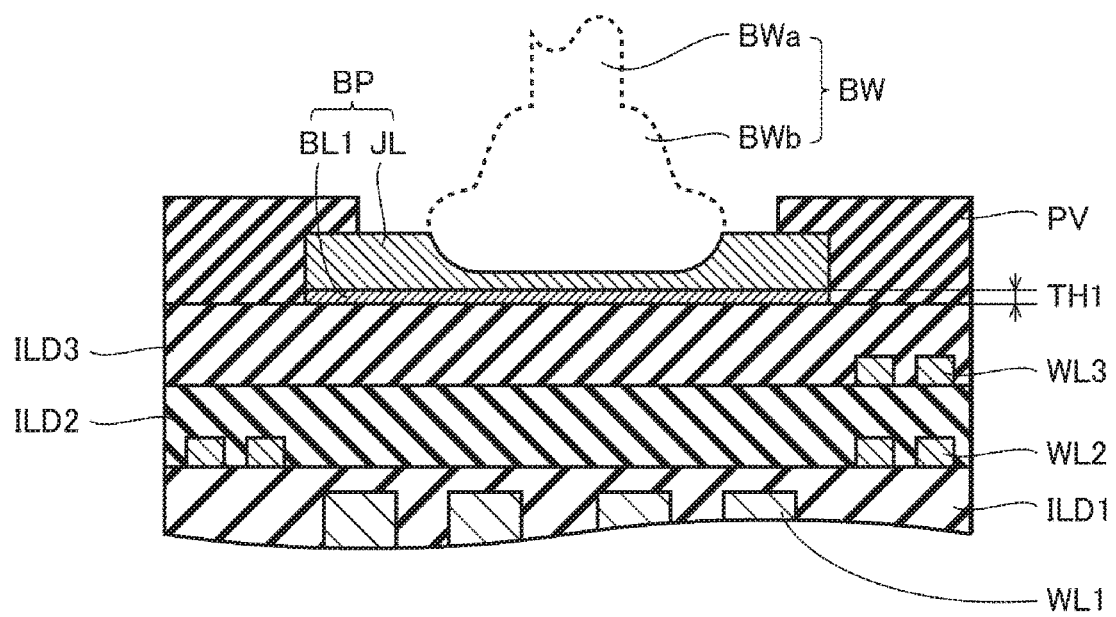
FIG. 2 is a cross-sectional view of semiconductor chip CHP of the semiconductor device according to the first embodiment.

As shown in FIG. 2, the semiconductor chip CHP further includes an interlayer insulating film ILD1, an interlayer insulating film ILD2, an interlayer insulating film ILD3, a wiring WL1, a wiring WL2, a wiring WL3, and a passivating film PV.

Although not shown in FIG. 2, the semiconductor chip CHP has a semiconductor substrate. The semiconductor substrate is formed of, for example, single crystal silicon (Si). A source region (not shown), a drain region (not shown), a well region (not shown), and the like of the transistor are formed in the semiconductor substrate. A gate insulating film (not shown) formed of, for example, silicon oxide ($SiO_2$) is formed on the well region sandwiched between the source region and the drain region. A gate electrode (not shown) formed of polycrystalline silicon doped with an impurity, for example, is formed on the gate insulating film.

An interlayer insulating film ILD1 is formed above the semiconductor substrate. The wiring WL1 is formed in the interlayer insulating film ILD1. The interlayer insulating film ILD1 is formed of, for example, silicon oxide. The wiring WL1 is formed of, for example, a material containing aluminum (aluminum or an aluminum alloy), or a material containing copper (copper or a copper alloy).

An interlayer insulating film ILD2 is formed on the interlayer insulating film ILD1. The wiring WL2 is formed in the interlayer insulating film ILD2. The interlayer insulating film ILD2 is formed of, for example, silicon oxide. The wiring WL2 is formed of, for example, a material containing aluminum (aluminum or an aluminum alloy), or a material containing copper (copper or a copper alloy).

The interlayer insulating film ILD3 is formed on the interlayer insulating film ILD2. The wiring WL3 is formed in the interlayer insulating film ILD3. The interlayer insulating film ILD3 is formed of, for example, silicon oxide. The wiring WL3 is formed of, for example, a material containing aluminum (aluminum or an aluminum alloy), or a material containing copper (copper or a copper alloy).

The bonding pads BP are formed on the interlayer insulating film ILD3. The bonding pad BP includes a barrier layer BL1 and a bonding layer JL. The barrier layer BL1 is formed on the interlayer insulating film ILD3. The bonding layer JL is formed on the barrier layer BL1.

The barrier layer BL1 has a thickness TH1. The thickness TH1 is preferably 0.03 μm or more and 0.2 μm or less. The thickness TH1 is more preferably 0.06 μm or more. The barrier layer BL1 is, for example, a single-layer film of titanium (Ti), titanium nitride (TiN), tantalum (Ta), or tantalum nitride (TaN), or a stacked film thereof. However, the materials constituting the barrier layer BL1 are not limited to these materials. The barrier layer BL1 prevents the intermetallic compound layer IMC, which will be described later, from entering the lower layer.

The bonding layer JL suppresses the barrier layer BL1 from being oxidized. The bonding layer JL is formed of a material containing aluminum, such as aluminum or an aluminum alloy. The bonding layer JL contains aluminum as a main component.

It is preferable that the wiring WL2 and the wiring WL3 are disposed at positions which do not overlap with the bonding pads BP in plan view. That is, it is preferable that the wiring WL2 and the wiring WL3 are arranged so as to bypass the bonding pads BPs in plan view. The wiring WL1 may be disposed at a position overlapping with the bonding pads BP in plan view.

The bonding wire BW has a wire portion BWa and a ball portion BWb. The wire portion BWa is a portion of the bonding wire BW having a wire-like shape. The ball portion BWb is a portion of the bonding wire BW having a ball shape. The ball portion BWb is formed at one end of the wire portion BWa.

The bonding wire BW is bonded to the bonding pad BP at a ball portion BWb formed at one end of the wire portion BWa. The bonding wire BW is formed of a material containing copper (copper or a copper alloy). The bonding wire BW is mainly composed of copper.

Figure 3:
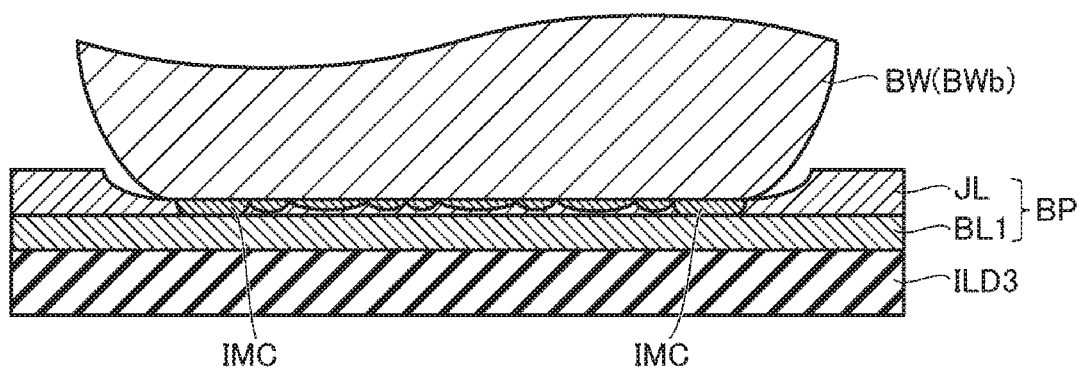
FIG. 3 is an enlarged cross-sectional view of a bonding part between a bonding pad BP and a bonding wire BW of the semiconductor device according to the first embodiment.

As shown in FIG. 3, an intermetallic compound layer IMC formed of an intermetallic compound containing copper and aluminum is formed so as to reach the barrier layer BL1 from the bonding wire BW (ball portion BWb) at least a portion of the bonding part between the bonding pad BP and the bonding wire BW (ball portion BWb). The intermetallic compound layer IMC formed so as to reach the barrier layer BL1 from the bonding wire BW is preferably arranged along the outer periphery of the bonding pad BP and the bonding wire BW. The intermetallic compound layer IMC formed so as to reach the barrier layer BL1 from the bonding wire BW preferably has a ring shape in plan view. The intermetallic compound layer IMC is formed of, for example, CuAl or $CuAl_2$.

As shown in FIG. 2, the passivating film PV is formed on the interlayer insulating film ILD3 so as to cover the end portions of the bonding pads BP. An opening penetrating the passivation film PV in the thickness direction is formed in the passivation film PV. The bonding pad BP is exposed from the opening. The passivating film PV is formed of, for example, silicon nitride ($Si_3N_4$).

Figure 4:
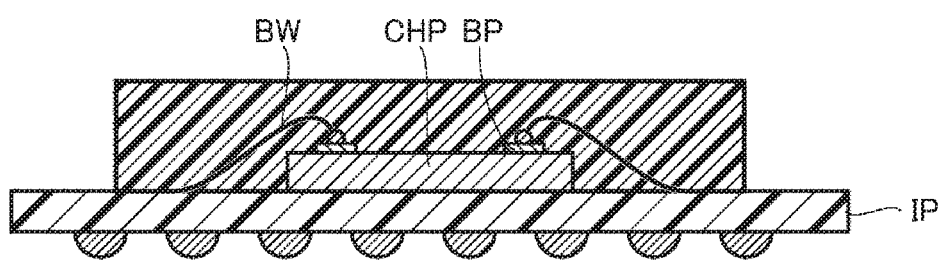
FIG. 4 is a cross-sectional view of a semiconductor device according to a modification of the first embodiment.

In the above description, the semiconductor device according to the first embodiment has the HLQFP structure, but as shown in FIG. 4, the semiconductor device according to the first embodiment may have Ball Grid Array (BGA) structure. That is, the semiconductor device according to the first embodiment may include an interposer IP instead of the lead frame LF. In this case, the other end of the bonding wire BW is connected to a wiring (not shown) formed on the surface of the interposer IP, and the sealing resin ER is formed on the surface of the interposer IP so as to cover the semiconductor chip CHP and the bonding wire BW.

Figure 5:
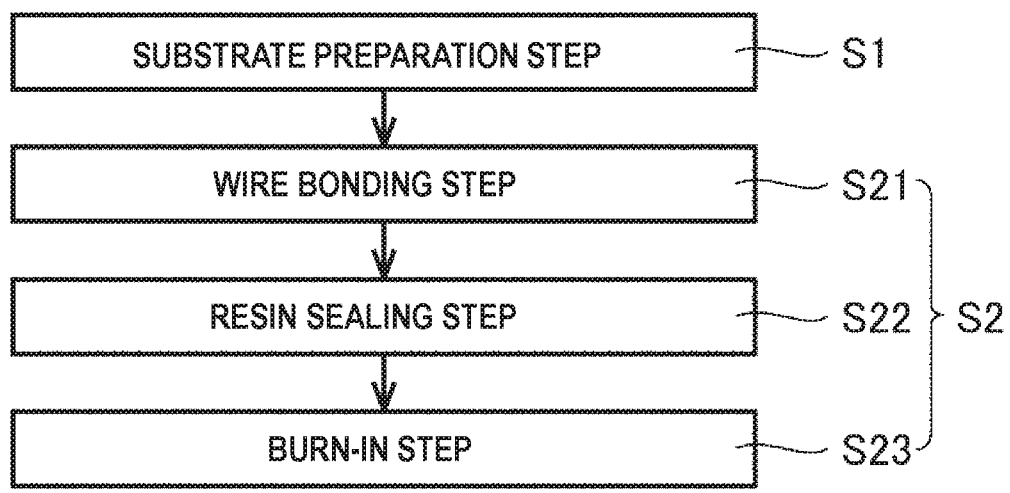
FIG. 5 is a process diagram showing the method of manufacturing the semiconductor device according to the first embodiment.

Hereinafter, a method of manufacturing the semiconductor device according to the first embodiment will be described. As shown in FIG. 5, the method of manufacturing a semiconductor device according to the first embodiment includes a semiconductor chip preparation step S1 and a bonding step S2. The bonding step S2 includes a wire bonding step S21, a resin sealing step S22, and a burn-in step S23.

Figure 6:
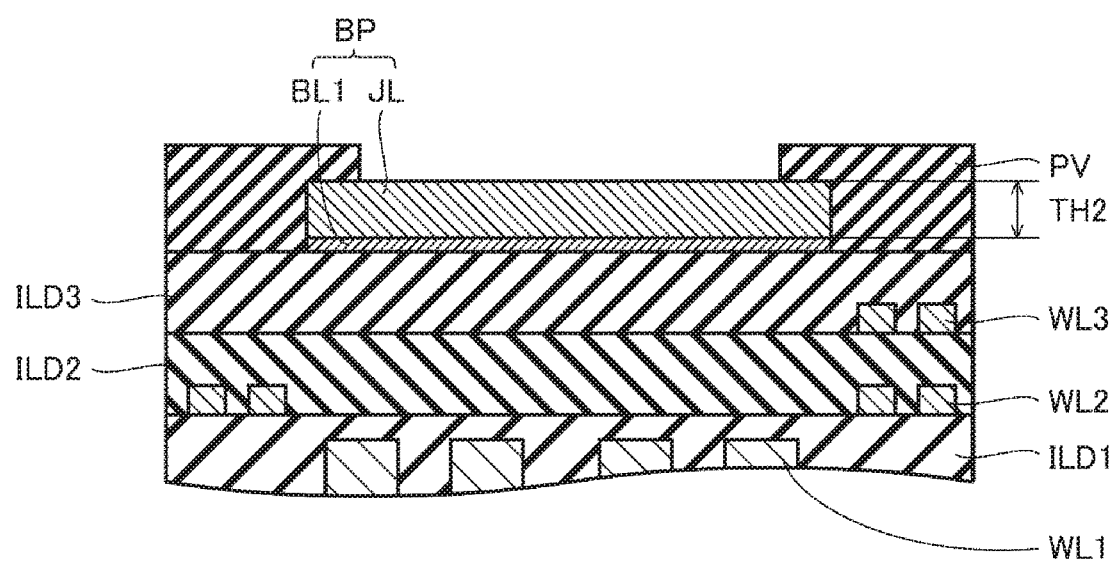
FIG. 6 is a cross-sectional view of the semiconductor device according to the first embodiment in the semiconductor chip preparation step S1.
Figure 7:
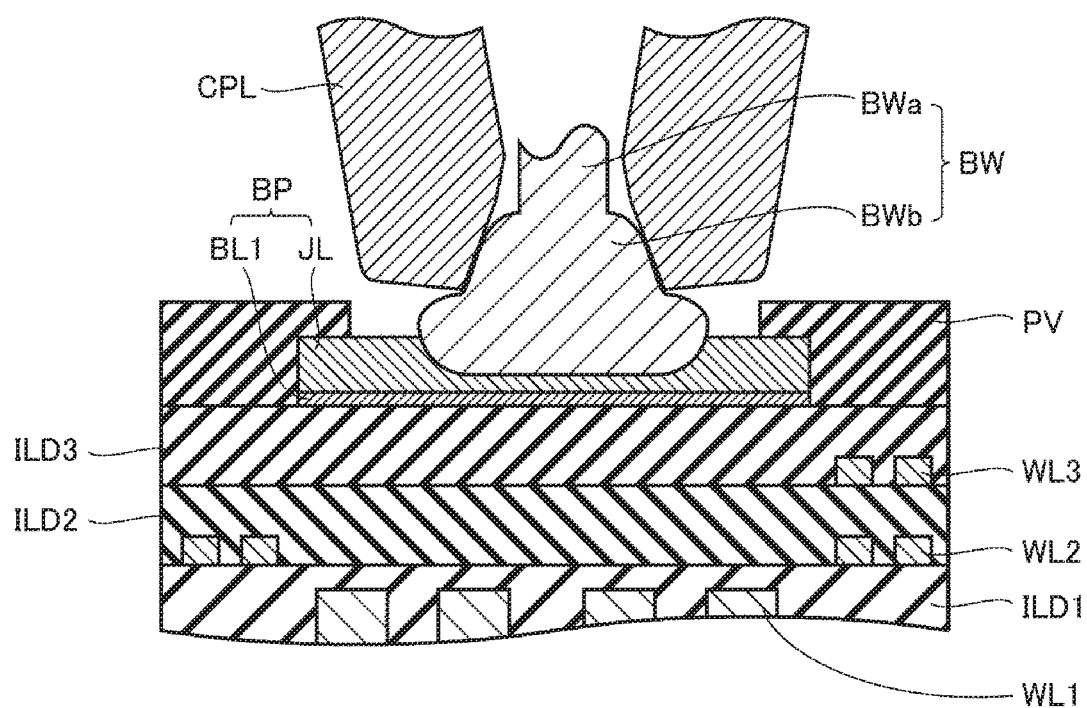
FIG. 7 is a cross-sectional view of the semiconductor device according to the first embodiment in the wire bonding step S21.

As shown in FIG. 6, in the semiconductor chip preparation step S1, the semiconductor chip CHP on which the bonding pad BP is formed is prepared. In the semiconductor-chip preparing step S1, the thickness TH2 of the bonding layer JL is preferably thinner than the thickness TH1 of the bonding layer JL. The thickness TH2 is preferably 0.01 μm or more and 2 μm or less.

In the bonding step S2, bonding of the bonding pad BP and the bonding wire BW is performed. As shown in FIG.

7, in the wire bonding step S21, the bonding wire BW is wire-bonded to the bonding pad BP.

In the wire bonding step S21, first, the bonding wire BW (ball portion BWb) is brought into contact with the bonding pad BP. At this time, the ball portion BWb is sandwiched by the capillary CPL from both sides. Second, a load is applied to the bonding wire BW so that the bonding wire BW is pressed toward the bonding pad BP in a state where the bonding wire BW and the bonding pad BP are in contact with each other. When the diameter of the ball portion BWb is 50 μm, the load is preferably 5 gf or more and 70 gf or less, for example.

Third, in a state where the bonding wire BW is pressed against the bonding pad BP, the ultrasonic wave are applied to the bonding wire BW via the capillary CPL, and the bonding wire BW (ball portion BWb) vibrates in the horizontal direction. As a result, the oxide film on the surface of the bonding wire BW and the oxide film on the surface of the bonding pad BP are destroyed by plastic deformation, and copper included in the bonding wire BW and aluminum included in the bonding layer JL are mutually diffused. The time for which the ultrasonic wave is applied is preferably 2 ms or more and 50 ms or less. The amplitude of the applied ultrasonic wave is preferably 0.2 μm or more and 1.5 μm or less when the diameter of the ball portion BWb after the ultrasonic wave application is 50 μm. This amplitude is an example when the ultrasonic wave is applied at 120 kHz. As described above, the intermetallic compound layer IMC is formed at the interface between the bonding wire BW and the bonding layer JL, and the bonding between the bonding wire BW and the bonding pad BP is achieved.

Figure 8:
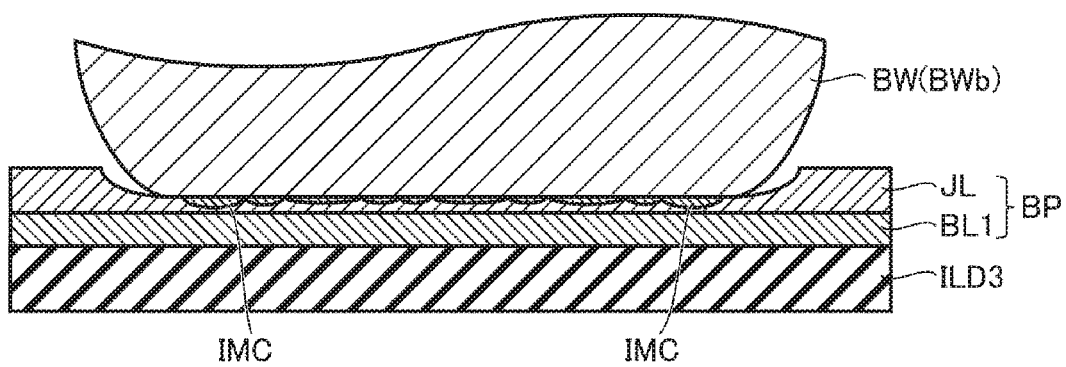
FIG. 8 is an enlarged cross-sectional view of a bonding part between the bonding pad BP and the bonding wire BW of the semiconductor device according to the first embodiment at the time when the wire bonding step S21 is completed.

As described above, since the capillary CPL has a shape that sandwiches the ball portion BWb from both sides, as the ball portion BWb of the bonding wire BW is deformed, the load and the ultrasonic wave is strongly applied to the vicinity of the outer periphery of the bonding part between the bonding wire BW and the bonding pad BP. Therefore, as shown in FIG. 8, the bonding layer JL is easily pushed out from between the bonding wire BW and the barrier layer BL1 in the vicinity of the outer periphery of the bonding part. As a result, the grown intermetallic compound layer IMC relatively easily reaches the barrier layer BL1 in the vicinity of the outer periphery of the bonding part.

When the wire bonding step S21 is completed, the intermetallic compound layer IMC does not need to grow to reach the barrier layer BL1. That is, at the time when the wire bonding step S21 is completed, the bonding layer JL may remain between the bonding wire BW and the barrier layer BL1.

However, the bonding layer JL may be completely pushed out from between the bonding wire BW and the barrier layer BL1 by adjusting the load applied to the bonding wire BW, the amplitude of the applied ultrasonic wave, or the duration of the application of the ultrasonic wave, so that the bonding layer JL does not remain between the bonding wire BW and the barrier layer BL1 at the time point when the bonding step S2 is completed.

In the resin sealing process S22, the sealing resin ER is formed. In the resin sealing step S22, first, the semiconductor chip CHP is placed in a mold, and the lead frame LF connected by the bonding wire BW is arranged. In the resin sealing step S22, second, the sealing resin ER before curing is injected into the mold.

In the resin sealing step S22, third, baking of the sealing resin ER is performed in order to cure the sealing resin ER. The baking is performed by holding the sealing resin ER at the first temperature $T_1$ for a first time $t_1$. The first temperature $T_1$ is, for example, 175° C. or more and 185° C. or less, and the first temperature $t_1$ is 5 hours.

In the burn-in step S23, a burn-in test is performed on the semiconductor device according to the first embodiment in order to detect an initial defect. In the burn-in step S23, firstly, the semiconductor device according to the first embodiment is heated. The semiconductor device according to the first embodiment is heated by holding the semiconductor device at the second temperature $T_2$ for the second time $t_2$. The second temperature $T_2$ is, for example, 85° C. or more and 140° C. or less, and the second temperature $t_2$ is 4 hours or more and 168 hours or less. In the burn-in step S23, second, an electrical characteristic test or the like is performed on the semiconductor device according to the first embodiment that has undergone the heating step.

At the end of the burn-in step S23 (when the bonding step S2 is completed), at least the portion of the bonding part between the bonding wire BW and bonding pad BP, the intermetallic compound layer IMC is grown to reach the barrier layer BL1 from the bonding wire BW. From another perspective, at the end of the burn-in step S23 (when the bonding step S2 is completed), at least the portion of the bonding part between the bonding wire BW and bonding pad BP, there is no bonding layer JL remaining between the bonding wire BW and the barrier layer BL1.

Assuming that the thickness of the intermetallic compound layer IMC at the stage at which the wire bonding step S21 is completed is a $TH_0$, the thickness $TH_{IMC}$ of the intermetallic compound layer IMC after the resin-sealing step S22 and the burn-in step S23 are expressed by the following equation. Where A and B are constants, units of $t_1$ and $t_2$ are seconds, units of $T_1$ and $T_2$ are Kelvins, and units of $TH_0$ are μm. When the diameter of the bonding wire BW in the ball portion BWb is 50 μm, the value of A is 0.0049 and the value of B is 11858.

$$TH_{IMC}^2 = A \times \{t_1 \times \exp(-B/T_1) + t_2 \times \exp(-B/T_2)\} + TH_0^2 \qquad \text{Equation 1}$$

Using this equation, the growth amount of the intermetallic compound layer IMC in the resin sealing step S22 and the burn-in step S23 can be calculated. Therefore, the load applied in the wire bonding step S21, the amplitude of the applied ultrasonic wave, or the duration of the application of the ultrasonic wave may be adjusted so that the smallest value of the thickness of the bonding layer JL remaining between the bonding wire BW and the barrier layer BL1 at the stage when the wire bonding step S21 is completed is less than the grown value.

Hereinafter, an effect of the semiconductor device according to the first embodiment will be described in comparison with the comparative example. The semiconductor device according to the comparative example includes a semiconductor chip CHP and a bonding wire BW. Bonding pads BP are formed on the semiconductor chip CHP. In this regard, the semiconductor device according to the comparative example has the same configuration as the semiconductor device according to the first embodiment.

Figure 9:
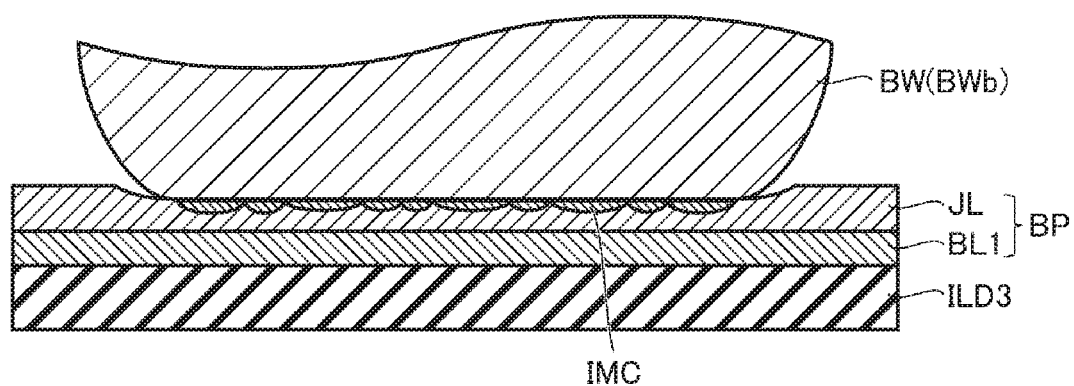
FIG. 9 is an enlarged cross-sectional view of a bonding part between the bonding pad BP and the bonding wire BW of the semiconductor device according to the comparative example.

However, as shown in FIG. 9, the configuration of the semiconductor device according to the comparative embodiment differs from the configuration of the semiconductor device according to the first embodiment in that the intermetallic compound layer IMC does not grow until the intermetallic compound layer IMC reaches the barrier layer BL1 (in that the bonding layer JL remains between the bonding wire BW and the barrier layer BL1).

In the case where the bonding wire BW is formed of a material containing copper, the hardness of the bonding wire BW is relatively high, and therefore, when a stress caused by a temperature cycle is applied to the bonding part between the bonding wire BW and the bonding pad BP, cracks tend to propagate through the bonding layer JL.

In the semiconductor device according to the comparative example, as described above, since the intermetallic compound layer IMC is not grown until the intermetallic compound layer IMC reaches the barrier layer BL1, the bonding layer JL between the bonding pad BP and the bonding wire BW is not interrupted halfway, and there is no portion at the bonding part between the bonding pad BP and the bonding wire BW that stops the propagation of cracks. With the propagation of such cracks, the bonding strength between the bonding pad BP and the bonding wire BW decreases.

On the other hand, in the semiconductor device according to the first embodiment, since the intermetallic compound layer IMC grows so as to reach the barrier layer BL1 in at least the portion of the bonding part of the bonding pad BP and the bonding wire BW, the bonding layer JL between the bonding pad BP and the bonding wire BW is divided by the intermetallic compound layer IMC in the middle.

As a result, the propagation of the crack generated due to the temperature cycle is apt to be stopped when the crack reaches the intermetallic compound layer IMC. As described above, according to the semiconductor device of the first embodiment, it is possible to suppress a decrease in the bonding strength between the bonding pad BP and the bonding wire BW after the temperature cycle is applied.

In the semiconductor device according to the first embodiment, since the thickness of the bonding layer JL remaining between the bonding wire BW and the barrier layer BL1 needs to be relatively small at the stage of performing the wire bonding step S21, the semiconductor device needs to apply a relatively strong load and the ultrasonic wave. As a result, in the wire bonding step S21, the wiring formed at the position overlapping with the bonding pad BP in plan view is liable to be damaged.

In the semiconductor device according to the first embodiment, when the wiring WL2 formed in the interlayer insulating film ILD2 and the wiring WL3 formed in the interlayer insulating film ILD3 are arranged so as not to overlap with the bonding pad BP in plan view, the above-described damage to the wiring can be suppressed.

The propagation of the crack caused by the temperature cycle tends to propagate from the outer periphery of the bonding part between the bonding pad BP and the bonding wire BW. Therefore, in the semiconductor device according to the first embodiment, when the intermetallic compound layer IMC grown so as to reach the barrier layer BL1 is disposed along the outer periphery of the bonding part between the bonding pads BP and the bonding wires BW, the propagation of cracks due to thermal cycling can be suppressed early.

Hereinafter, a temperature cycle test performed to confirm the effect of the semiconductor device according to the first embodiment will be described.

In the temperature cycle test, a temperature cycle was applied to the semiconductor device according to the first embodiment and the semiconductor device according to the comparative example. In the temperature cycle test, a temperature change in the range of −65° C. to 150° C. was taken as one cycle.

In the temperature cycle test, the bonding strength was evaluated by measuring the shear strength between the bonding pad BP and the bonding wire BW after 500 cycles, 1000 cycles, and 2000 cycles of the temperature cycle were applied. In the semiconductor device subjected to the temperature cycle test, the diameter of the bonding wire BW in the ball portion BWb was 52 μm.

Figure 10:
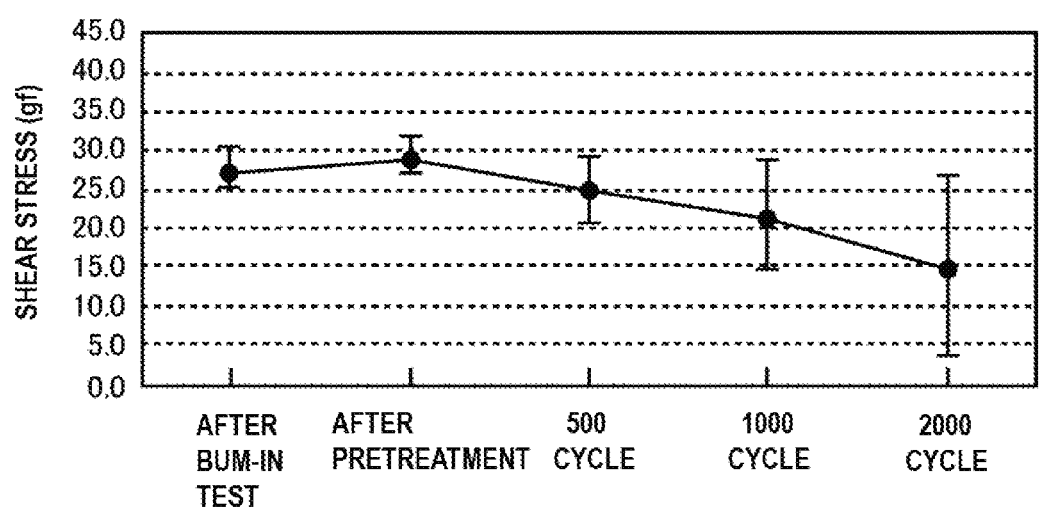
FIG. 10 is a graph showing the relationship between the number of temperature cycles and the bonding strength of the bonding pad BP and the bonding wire BW in the semiconductor device according to the comparative example.
Figure 11:
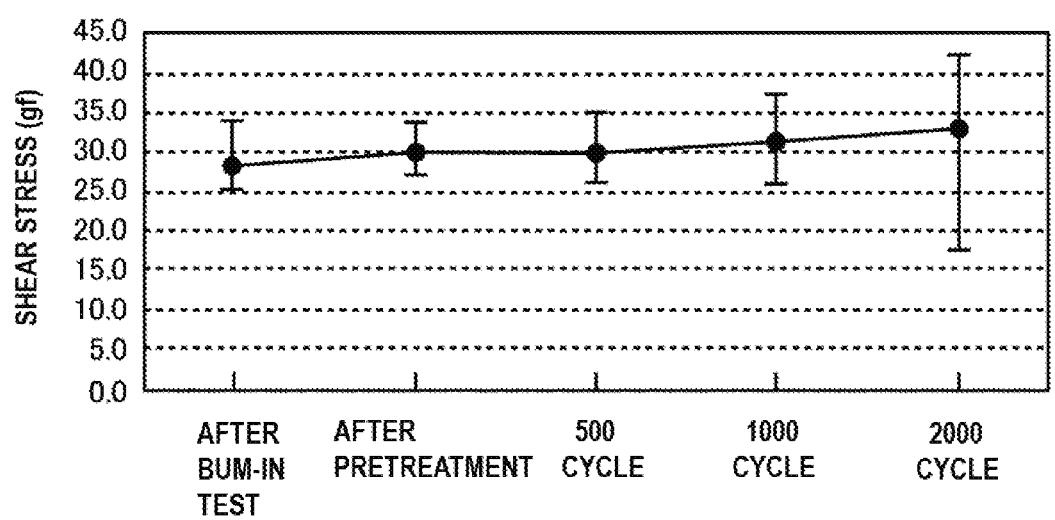
FIG. 11 is a graph showing the relationship between the number of temperature cycles and the bonding strength of the bonding pad. BP and the bonding wire BW in the semiconductor device according to the first embodiment.

As shown in FIGS. 10 and 11, after the burn-in test and a pretreatment, the semiconductor device according to the first embodiment and the semiconductor device according to the comparative example had sufficient bonding strength between the bonding pad BP and the bonding wire BW. The pretreatment is a treatment for performing heating corresponding to heating when the semiconductor device according to the first embodiment and the semiconductor device according to the comparative example are mounted on a printed wiring board by soldering. In FIGS. 10 and 11, error bars indicate the maximum and minimum values of the measured bonding strengths.

As shown in FIG. 10, in the semiconductor device according to the comparative example, the bonding strength between the bonding pad BP and the bonding wire BW remarkably decreased as the number of temperature cycles to be applied increased. In the semiconductor device according to the comparative example, the minimum value of the bonding strength between the bonding pad BP and the bonding wire BW was less than 5.7 gf after the temperature cycle of 2000 cycles was applied. The value of 5.7 gf is a required value of the bonding strength between the bonding pads BP and the bonding wires BW defined by AEC-Q006/AEC-Q100.

On the other hand, as shown in FIG. 11, in the semiconductor device according to the first embodiment, even if the number of temperature cycles to be applied is increased, the decrease in the bonding strength between the bonding pad BP and the bonding wire BW is moderate. In the semiconductor device according to the first embodiment, the minimum value of the bonding strength between the bonding pad BP and the bonding wire BW exceeds 5.7 gf even after the temperature cycle of 2000 cycles is applied.

As described above, according to the semiconductor device of the first embodiment, it has been experimentally shown that, as a result of suppressing the propagation of the crack due to the addition of the temperature cycle, the decrease in the bonding strength after the addition of the temperature cycle is suppressed.

Second Embodiment

The configuration of a semiconductor device according to a second embodiment will be described below. It should be noted that points different from the configuration of the semiconductor device according to the first embodiment will be mainly described, and description thereof will not be repeated.

Figure 12:
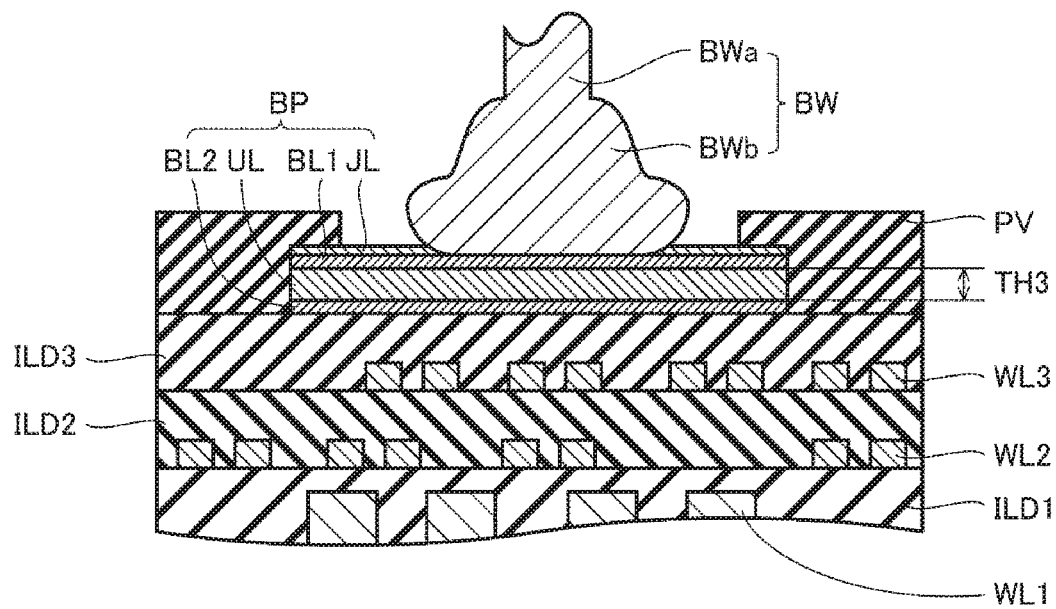
FIG. 12 is an enlarged cross-sectional view of a bonding part between a bonding pad BP and a bonding wire BW of the semiconductor device according to a second embodiment.

As shown in FIG. 12, the semiconductor device according to the second embodiment includes a semiconductor chip CHP on which a bonding pad BP is formed and a bonding wire BW. The semiconductor chip CHP includes an interlayer insulating film ILD1, an interlayer insulating film ILD2, an interlayer insulating film ILD3, a wiring WL1, a wiring WL2, and a wiring WL3.

The bonding pad BP includes a barrier layer BL1 and a bonding layer JL. The intermetallic compound layer IMC is grown from the bonding wire BW to the barrier layer BL1 at least in a portion of a bonding part between the bonding pad BP and the bonding wire BW. In these respects, the configuration of the semiconductor device according to the second embodiment is common to the configuration of the semiconductor device according to the first embodiment.

However, the configuration of the semiconductor device according to the second embodiment differs from the configuration of the semiconductor device according to the first embodiment with respect to the details of the bonding pads BP, the wiring WL1, and the wiring WL2. This difference will be mainly explained below.

As shown in FIG. 12, the bonding pad BP includes a base layer UL and a barrier layer BL2 in addition to the barrier layer BL1 and the bonding layer JL.

The barrier layer BL2 is formed on the interlayer insulating film ILD3. The barrier layer BL2 is formed of, for example, a titanium-containing material. A base layer UL is formed on the barrier layer BL2. The base layer UL is formed of a material containing aluminum, such as aluminum or an aluminum alloy. The base layer UL has a thickness TH3. The thickness TH3 is, for example, 0.4 µm or less. The barrier layer BL1 is formed on the base layer UL, and the bonding layer JL is formed on the barrier layer BL1.

The wiring WL2 is disposed so as to overlap the bonding pads BPs in plan view. The wiring WL3 is disposed so as to overlap the bonding pads BPs in plan view.

A method of manufacturing the semiconductor device according to the second embodiment is the same as the method of manufacturing the semiconductor device according to the first embodiment, and therefore the description thereof is omitted.

Hereinafter, effects of the semiconductor device according to the second embodiment will be described. It should be noted that points different from the effects of the semiconductor device according to the first embodiment will be mainly described, and description thereof will not be repeated.

In the semiconductor device according to the second embodiment, since the base layer UL is formed in the lower layer of the barrier layer BL1, the load applied to the bonding pads BP in the wire bonding step S21 is relieved by the base layer UL. Therefore, in the semiconductor device according to the second embodiment, even if the wiring WL2 and the wiring WL3 are arranged so as to overlap the bonding pads BP in plan view, damage to the wiring WL2 and the wiring WL3 can be suppressed.

Third Embodiment

Since a configuration of a semiconductor device according to a third embodiment is the same as that of the semiconductor device according to the first embodiment, detailed description thereof will be omitted. However, in the semiconductor device according to the third embodiment, the wiring WL2 may be arranged so as to overlap with the bonding pads BP in plan view. Further, the wiring WL3 may be disposed so as to overlap the bonding pads BPs in plan view.

Hereinafter, a method of manufacturing the semiconductor device according to the third embodiment will be described. It should be noted that differences from the manufacturing method of the semiconductor device according to the first embodiment will be mainly described, and description thereof will not be repeated.

Figure 13:
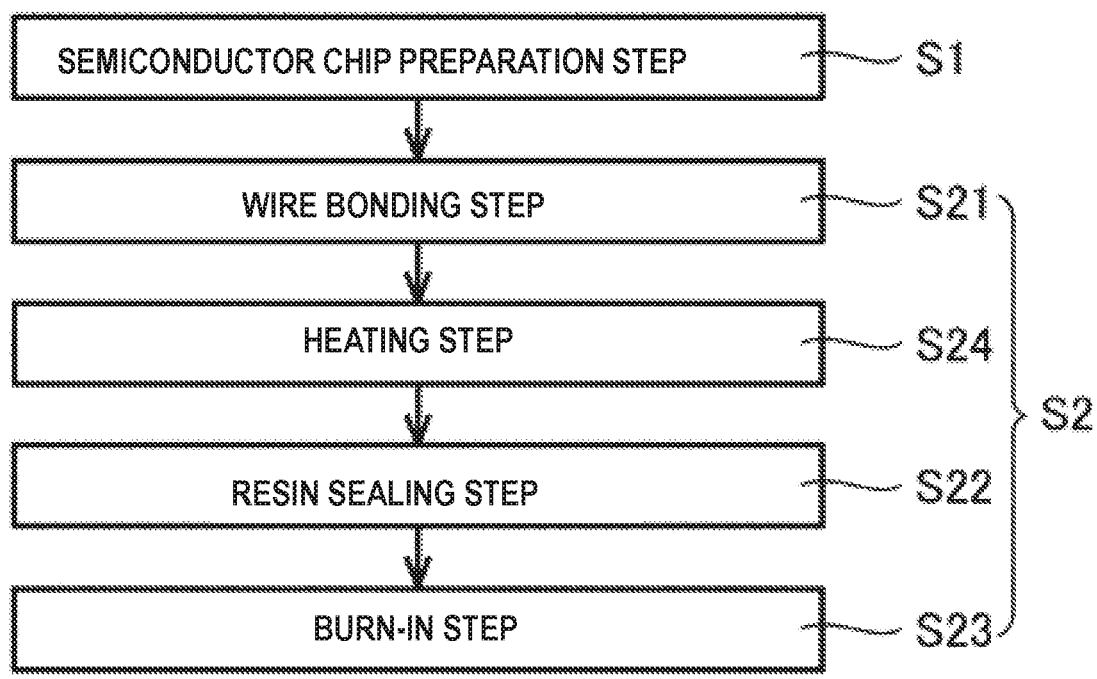
FIG. 13 is a process diagram showing a method of manufacturing a semiconductor device according to the third embodiment.

As shown in FIG. 13, the method of manufacturing the semiconductor device according to the third embodiment includes a semiconductor chip preparation step S1 and a bonding step S2. The bonding step S2 includes a wire bonding step S21, a resin sealing step S22, and a burn-in step S23. In these respects, the manufacturing method of the semiconductor device according to the third embodiment is common to the method of manufacturing the semiconductor device according to the first embodiment.

However, the manufacturing method of the semiconductor device according to the third embodiment differs from the manufacturing method of the semiconductor device according to the first embodiment in that the bonding step S2 further includes a heating step S24. The method of manufacturing the semiconductor device according to the third embodiment differs from the method of manufacturing the semiconductor device according to the first embodiment in the details of the wire bonding step S21.

In the method of manufacturing the semiconductor device according to the third embodiment, the load applied in the wire bonding step S21 may be relatively low as compared with the method of manufacturing a semiconductor device according to the first embodiment. In the manufacturing method of the semiconductor device according to the third embodiment, the amplitude of the ultrasonic wave applied in the wire bonding step S21 may be relatively small as compared with the manufacturing method of the semiconductor device according to the first embodiment. In the method of manufacturing the semiconductor device according to the third embodiment, the time for which the ultrasonic wave is applied in the wire bonding step S21 may be relatively short as compared with the method of manufacturing the semiconductor device according to the first embodiment.

Figure 14:
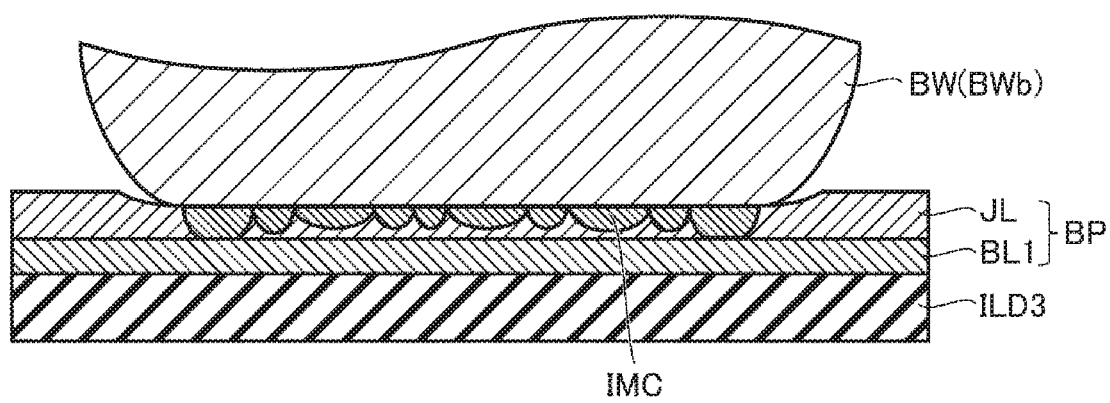
FIG. 14 is an enlarged cross-sectional view of a bonding part between the bonding pad BP and the bonding wire BW of the semiconductor device according to the third embodiment at the time when the wire bonding step S21 is completed.

As a result, as shown in FIG. 14, in the manufacturing process of the semiconductor device according to the third embodiment, the bonding layer JL may remain relatively thick between the bonding wire BW and the barrier layer BL1 at the stage when the wire bonding step S21 is completed.

The heating step S24 is performed after the wire bonding step S21. The heating step S24 is preferably performed before the resin sealing step S22. The heat step S24 is performed by holding the semiconductor device according to the third embodiment at the third temperature $T_3$ for the third time $t_3$. The intermetallic compound layer IMC grows in the heating step S24 in addition to the resin sealing step S22 and the burn-in step S23.

Therefore, even when the bonding layer JL remains relatively thick between the bonding wire BW and the barrier layer BL1 as described above, the intermetallic compound layer IMC grows to reach the barrier layer BL1 in at least a portion of the bonding part between the bonding wire BW and the bonding pad BP at the stage when the bonding step S2 is completed.

The third temperature $T_3$ and the third temperature $t_3$ are appropriately selected in view of the thickness of the bonding layer JL remaining between the bonding wire BW and the barrier layer BL1 at the stage when the wire bonding step S21 is completed, and the growth amounts of the intermetallic compound layers IMC grown in the resin-sealing step S22 and the burn-in step S23.

Hereinafter, effects of the semiconductor device according to the third embodiment will be described. It should be noted that points different from the effects of the semiconductor device according to the first embodiment will be mainly described, and description thereof will not be repeated.

In the semiconductor device according to the third embodiment, since the intermetallic compound layer IMC also grows in the heating step S24, the intermetallic compound layer IMC reaches the barrier layer BL1 even if the load and the ultrasonic wave are relatively strongly applied in the wire bonding step S21 and the intermetallic compound layer IMC is not pushed out from between the bonding wire BW and the barrier layer BL1. In the semiconductor device according to the third embodiment, it is possible to suppress the occurrence of damage to the wiring under the bonding pad BP.

The sealing resin ER may contain a halogen (chlorine, bromine, or the like) based compound or a sulfur based compound. Such compounds have the property of corroding aluminum and copper. Therefore, when the heating step S24 is performed after the resin sealing step S22, the bonding part between the bonding wire BW and the bonding pad BP may be corroded by the compound as described above. In the method of manufacturing the semiconductor device according to the third embodiment, the heating step S24 is performed before the resin sealing step S22, whereby the occurrence of corrosion of the bonding part due to the compound as described above can be suppressed.

Although the invention made by the present inventor has been specifically described based on the embodiments, the present invention is not limited to the embodiments described above, and it is needless to say that various modifications can be made without departing from the gist thereof.

What is claimed is:

1. A method of manufacturing a semiconductor device, comprising the steps of:
   (a) providing a semiconductor chip having a bonding pad, the bonding pad including a barrier layer and a bonding layer formed on the barrier layer, the bonding layer formed of a material containing aluminum;
   (b) bonding, by applying a load to a bonding wire formed of a material containing copper, the bonding wire to the bonding pad such that an intermetallic compound layer formed of an intermetallic compound containing copper from the bonding wire and aluminum from bonding layer is formed in the bonding layer between the bonding wire and the barrier layer while the intermetallic compound layer does not reach the barrier layer; and after the step (b) completes, (c) heating, without apply the load to the bonding wire, the semiconductor chip on which the bonding of the bonding wire to the bonding pad has been performed such that at least a portion of the intermetallic compound layer reaches the barrier layer, wherein a temperature at which the semiconductor chip is heated is determined based on a thickness of the bonding layer remaining between the bonding wire and the barrier layer after the step (b) completes and before the step (c) is performed.

2. The method of manufacturing a semiconductor device according to claim 1, further comprising the steps of:
   (d) after the step (c), sealing with resin the semiconductor chip and the bonding wire; and
   (e) after the step (d), performing a burn-in test on the semiconductor chip.

3. The method for manufacturing a semiconductor device according to claim 1, wherein the thickness of the bonding layer is 0.01 µm or more and 2 µm or less.

* * * * *